(12) United States Patent
Huang (10) Patent No.: US 7,439,778 B2
(45) Date of Patent: Oct. 21, 2008

(54) SIGNAL SAMPLING APPARATUS AND METHOD

(75) Inventor: Chao-Ming Huang, Kao-Hsiung (TW)

(73) Assignee: Realtek Semiconductor Corp., HsinChu (TW)

( * ) Notice: Subject to any disclaimer, the term of this patent is extended or adjusted under 35 U.S.C. 154(b) by 51 days.

(21) Appl. No.: 11/382,718

(22) Filed: May 11, 2006

(65) Prior Publication Data

US 2006/0255840 A1 Nov. 16, 2006

(30) Foreign Application Priority Data

May 11, 2005 (TW) .............................. 94115192 A (51) Int. Cl.
 *H03K 17/00* (2006.01)
(52) U.S. Cl. .......................................... 327/94; 327/96
(58) Field of Classification Search ........................ None
 See application file for complete search history.

(56) References Cited

U.S. PATENT DOCUMENTS

| | | | | |
|---|---|---|---|---|
| 5,349,305 A | * | 9/1994 | Hsiao et al. | 330/253 |
| 5,786,712 A | * | 7/1998 | Grasset | 327/94 |
| 5,798,660 A | * | 8/1998 | Cheng | 327/65 |
| 5,847,600 A | * | 12/1998 | Brooks et al. | 330/9 |
| 6,169,427 B1 | * | 1/2001 | Brandt | 327/94 |
| 6,778,009 B1 | * | 8/2004 | Lee | 330/9 |

\* cited by examiner

*Primary Examiner*—Kenneth B. Wells
*Assistant Examiner*—An T. Luu
(74) *Attorney, Agent, or Firm*—Winston Hsu (57) ABSTRACT

A signal sampling apparatus for generating an output signal according to an input signal is disclosed. The signal sampling system includes a sample and hold circuit and a gain controller. The sample and hold circuit is used for sampling the input signal to generate a sample signal in a sample mode, and the sample and hold circuit includes an amplifier having a gain for generating the output signal according to the sample signal in a hold mode. The gain controller is coupled to the amplifier for adjusting the gain in the sample mode.

17 Claims, 10 Drawing Sheets

SIGNAL SAMPLING APPARATUS AND METHOD

BACKGROUND OF THE INVENTION

1. Field of the Invention

The invention relates to a signal sampling apparatus, and more particularly, to a signal sampling apparatus having a sample and hold circuit.

2. Description of the Prior Art

Sample and hold circuits have been utilized in many circuits. For example, a sample and hold circuit can be utilized in an analog to digital converter, placed inside an optical disk drive in order to detect amplitudes of reading signals, or placed in the transmitter of a communication device.

Figure 1:
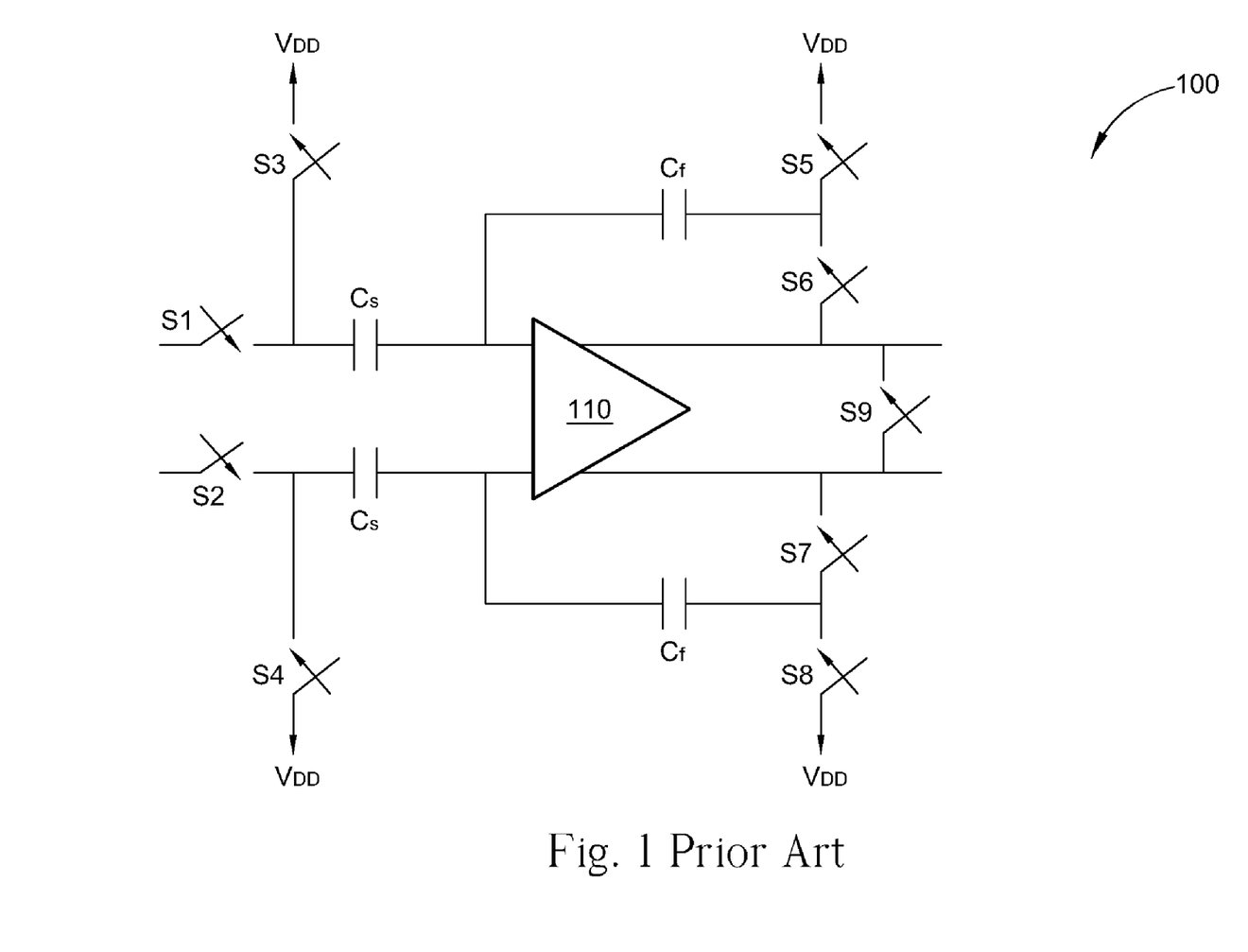
FIG. 1 is a diagram of a sample and hold circuit according to the prior art.

Please refer to FIG. 1, which is a diagram of a sample and hold circuit 100 according to the prior art. As shown in FIG. 1, the sample and hold circuit 100 comprises an operational amplifier 110, a plurality of switches S1, S2, S3, S4, S5, S6, S7, S8, and S9, a plurality of sampling capacitors Cs, and a plurality of feedback capacitors Cf. They are connected as shown in FIG. 1.

Figure 2:
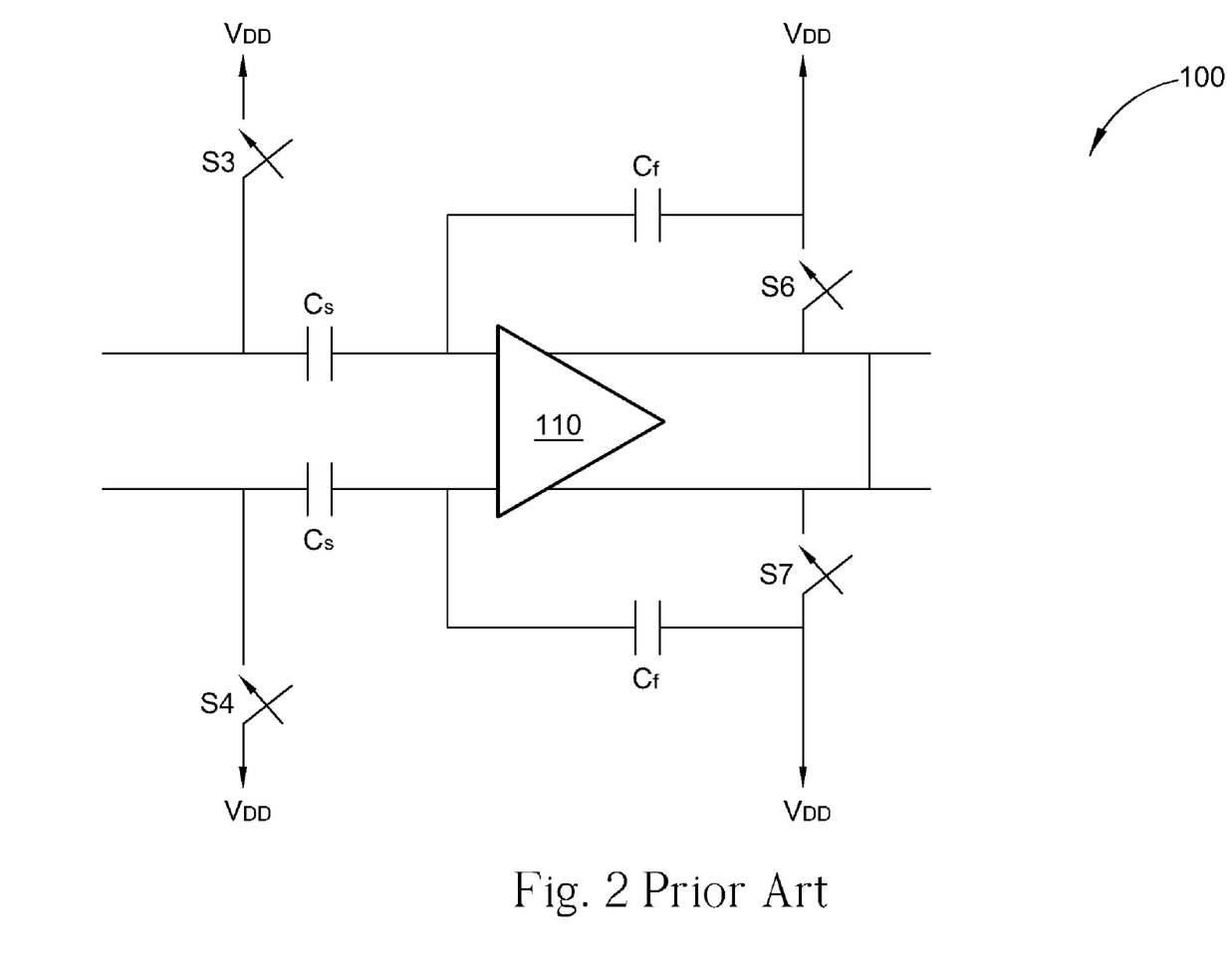
FIG. 2 is a diagram of the prior art sample and hold circuit in a sample mode.

In a sample mode, the switches S1, S2, S5, S8, and S9 are turned on, and the switches S3, S4, S6, and S7 are turned off. Please refer to FIG. 2, which is a diagram of the sample and hold circuit 100 in the sample mode. At this time, an input signal is inputted into the two input ends of the sample and hold circuit 100. The input signal is then stored in the sampling capacitors Cs and the feedback capacitors Cf, where the two output ends are limited as differential zero because the switch S9 is turned on.

Figure 3:
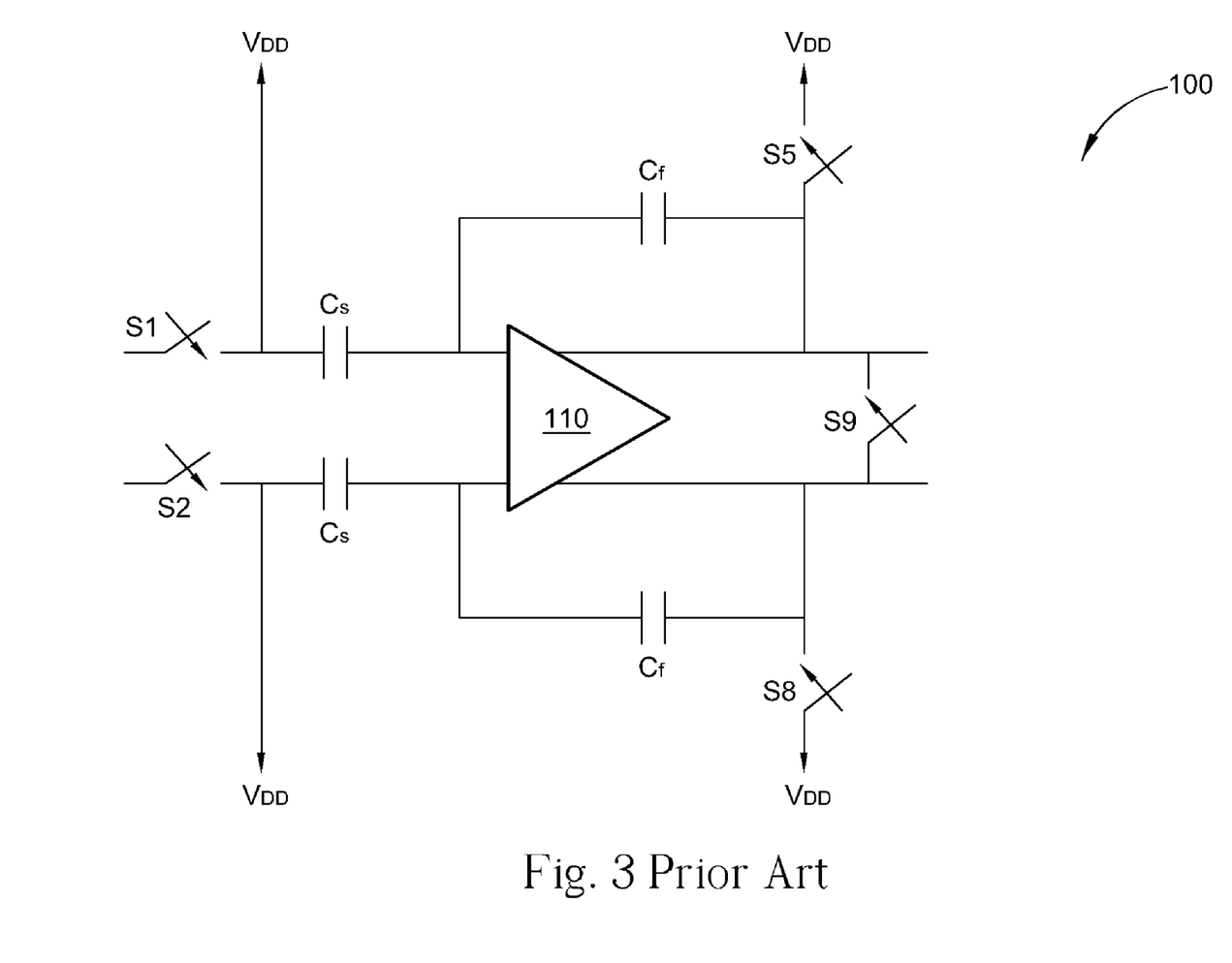
FIG. 3 is a diagram of the prior art sample and hold circuit in a hold mode.

On the other hand, in a hold mode, the switches S1, S2, S5, S8, and S9 are turned off, and the switches S3, S4, S6, and S7 are turned on. Please refer to FIG. 3, which is a diagram of the sample and hold circuit 100 in the hold mode. As shown in FIG. 3, in the hold mode, the feedback capacitors form a negative feedback loop. As known by those skilled in the art, the charges stored in the sample mode are redistributed according to the capacitances of the sampling capacitors Cs and the feedback capacitors Cf. Assuming that the sampling capacitors Cs and the feedback capacitors Cf have the same capacitance, the two output ends output the signal sampled in the sample mode.

Figure 4:
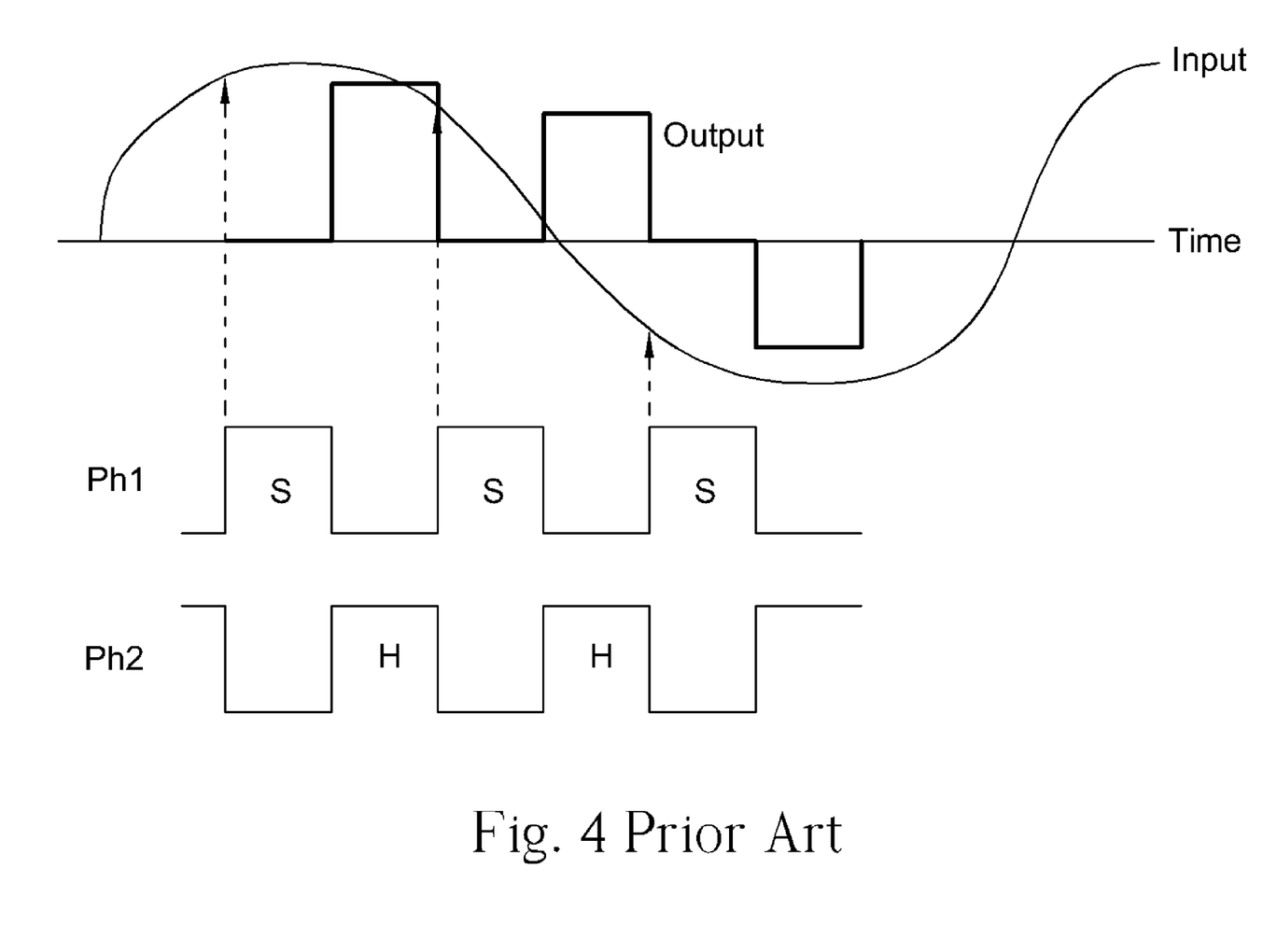
FIG. 4 is a signal diagram of the sample and hold circuit shown in FIG. 1.

Please refer to FIG. 4, which is a signal diagram of the sample and hold circuit 100 shown in FIG. 1. As shown in FIG. 4, a clock ph1 and a clock ph2 are respectively utilized to define the sampling mode and the hold mode. In other words, the above-mentioned switches S1-S9 are turned on/off according to the clocks ph1 and ph2. Therefore, at the rising edge of the clock ph1, when ph1 is high and ph2 is low, the sample and hold circuit 100 samples the input signal and outputs a ground signal (this means that the signal is differential zero) for the switch S9 is turned on. On the other hand, at the rising edge of the clock ph2, when ph1 is low and ph2 is high, the sample and hold circuit 100 outputs the signal sampled in the sample mode.

Generally speaking, in order to provide a high resolution, meaning that to provide an output signal having a large bit number, the operational amplifier 110 is designed to have a high gain. In the sample mode, however, the switch S9 is utilized to limit the output of the operational amplifier 110 as a differential zero. Therefore, the switch S9 needs more time to charge/discharge when the gain of the operational amplifier 110 is very large.

In addition, if the charge/discharge time is more than half the period of the clock ph1, this represents that at the rising edge of the clock ph2, the output of the operational amplifier 110 is not back to differential zero. This result directly influences the circuit operation in the sample mode. In order to solve this problem, the switch S9 can be designed to have a bigger size such that the switch S9 can have a smaller turn-on resistor to reduce the charge/discharge time. This method also increases the chip area, however, and therefore raises costs because of this increased chip area.

SUMMARY OF THE INVENTION

It is therefore one of the objectives of the claimed invention to provide a signal sampling circuit capable of adjusting gain such that the gain of the operational amplifier is appropriately controlled. This allows the signal sampling circuit to not only output a digital signal having a higher resolution, but also to solve the above-mentioned problem of long charge/discharge time due to the high gain.

According to an exemplary embodiment of the claimed invention, a signal sampling apparatus for generating an output signal according to an input signal is disclosed. The signal sampling apparatus comprises: a sample and hold circuit (S/H circuit), for sampling the input signal in a sample mode to generate a sample signal, the sample and hold circuit comprising an amplifier having a gain for generating the output signal according to the sample signal in a hold mode; and a gain controller, coupled to the amplifier, for adjusting the gain.

According to an exemplary embodiment of the claimed invention, a signal sampling method for generating an output signal according to an input signal is disclosed. The signal sampling method comprises: sampling the output signal in a sample mode in order to generate a sample signal; generating the output signal according to the sample signal and a gain in a hold mode; and adjusting the gain in the sample mode.

According to an exemplary embodiment of the claimed invention, a signal sampling apparatus for sampling an input signal to generate an output signal is disclosed. The signal sampling apparatus comprises: a sample and hold unit for performing a sampling operation on the input signal in a sample mode and generating the output signal according to a result of the sampling operation in a hold mode, the sample and hold unit comprising a gain unit for providing a gain; and a gain adjusting unit, coupled to the gain unit, for generating a control signal to adjust the gain.

These and other objectives of the present invention will no doubt become obvious to those of ordinary skill in the art after reading the following detailed description of the preferred embodiment that is illustrated in the various figures and drawings.

DETAILED DESCRIPTION

Figure 5:
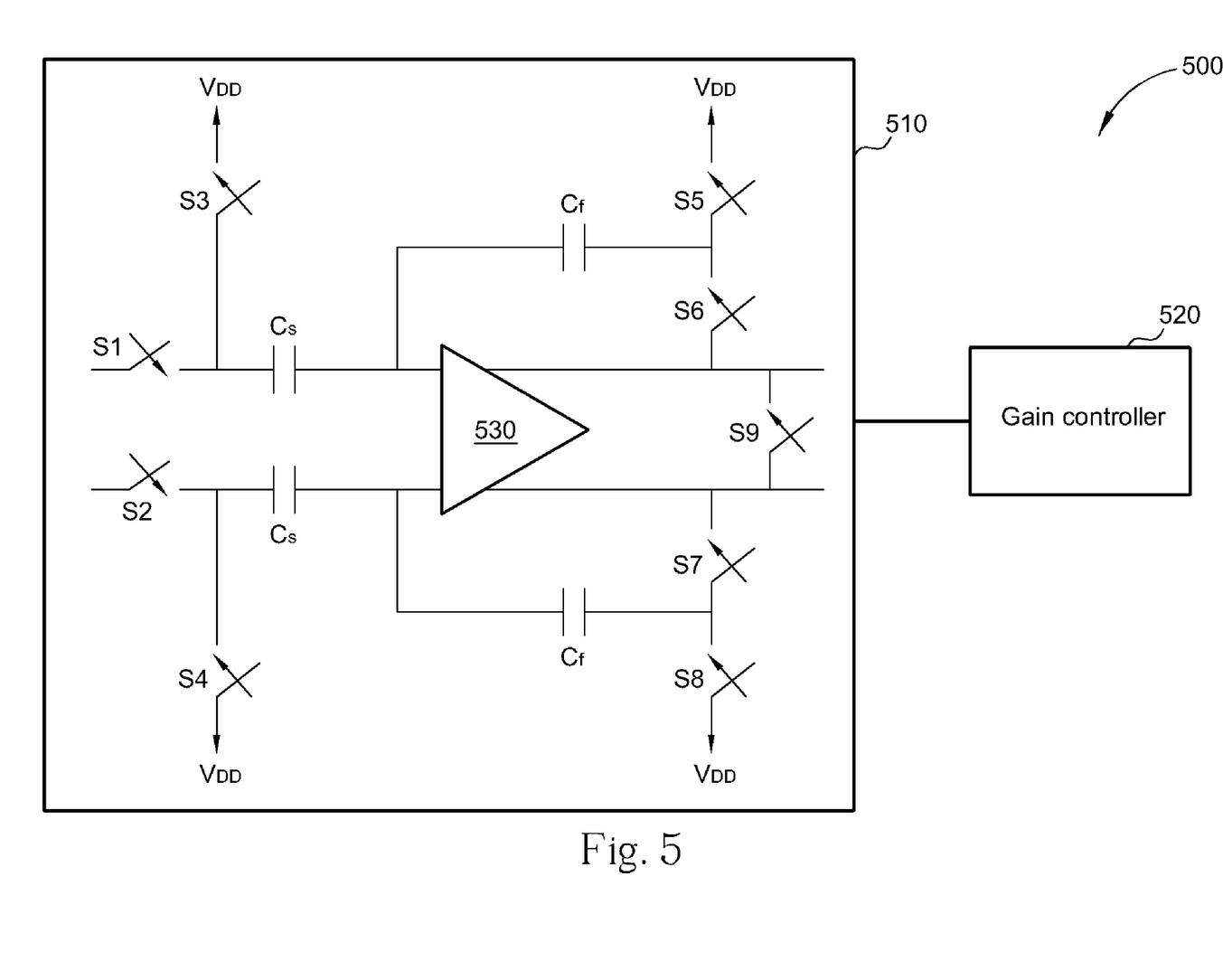
FIG. 5 is a functional block diagram of a signal sampling apparatus of an embodiment according to the present invention.

Please refer to FIG. 5, which is a functional block diagram of a signal sampling apparatus 500 of an embodiment according to the present invention. As shown in FIG. 5, the signal sampling apparatus 500 comprises a sample and hold circuit 510 and a gain controller 520, coupled to the sample and hold circuit 510. In this embodiment, the sample and hold circuit 510 comprises an operational amplifier 530, a plurality of switches S1, S2, S3, S4, S5, S6, S7, S8, and S9, a plurality of sampling capacitors Cs, and a plurality of feedback capacitors Cf. As the functions and operations of the sample and hold circuit 510 have been illustrated in the above disclosure, they are omitted here. Please note that the sample and hold circuit 510 shown in FIG. 5 is only utilized as an embodiment, not a limitation of the present invention.

In this embodiment, the gain controller 520 is utilized to reduce the gain of the operational amplifier 530 in the sample mode. Therefore, the switch S9 can successfully pull down the output of the operational amplifier 530 in a predetermined clock period. Furthermore, in the hold mode, the original high gain of the operational amplifier 530 can be recovered. Therefore, the above-mentioned gain controlling operation does not influence the predetermined resolution of the sample and hold circuit 510. The detailed operations of the gain controller 520 are illustrated in the following disclosure.

Figure 6:
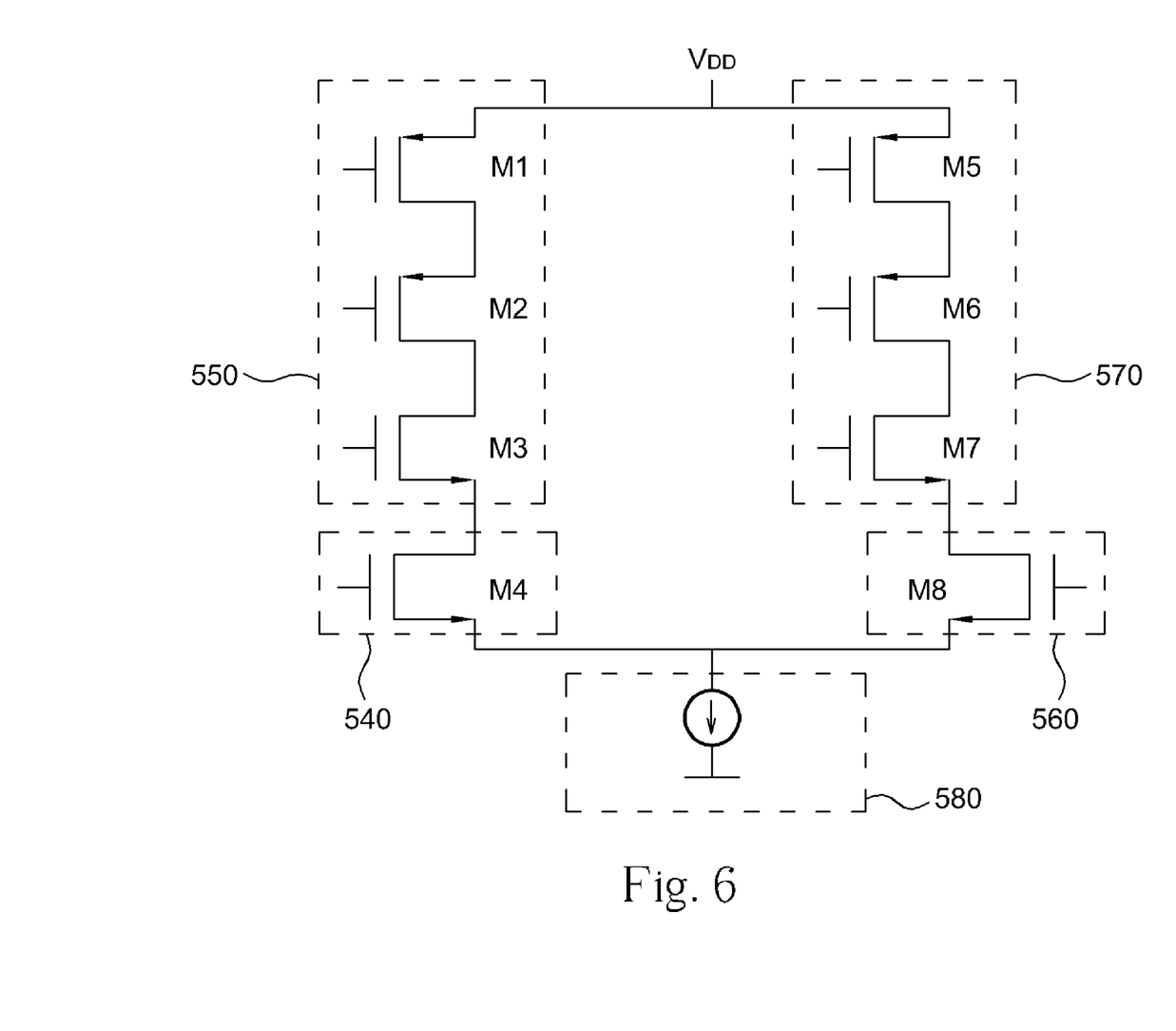
FIG. 6 is a diagram of the operational amplifier shown in FIG. 5 of an embodiment according to the present invention.

Please refer to FIG. 6, which is a diagram of the operational amplifier 530 shown in FIG. 5 of an embodiment according to the present invention. As shown in FIG. 6, the operational amplifier 530 is a differential operational amplifier. The operational amplifier 530 comprises a first input stage 540, a first gain stage 550, a second input stage 560, a second gain stage 570, and a bias 580, where the first input stage 540 comprises a transistor M4, the first gain stage 550 comprises three transistors M1, M2, M3, the second input stage 560 comprises a transistor M8, and second gain stage 570 comprises three transistors M5, M6, M7. The transistors M1-M4 are symmetric to the transistors M5-M8, where the gates of the transistors M4 and M8 are input ends of the operational amplifier 530, the gates of the transistors M1-M3, and M5-M7 are respectively controlled by different biasing values. Please note that the node between the transistors M2 and M3 and the node between the transistors M6 and M7 are the output ends of the operational amplifier 530. As the functions and the operations of the operational amplifier 530 are well known, they are omitted here.

As mentioned previously, the gain controller 520 is utilized to adjust the gain of the operational amplifier 530. Therefore, switches can be utilized to adjust the gain of the operational amplifier.

Figure 7:
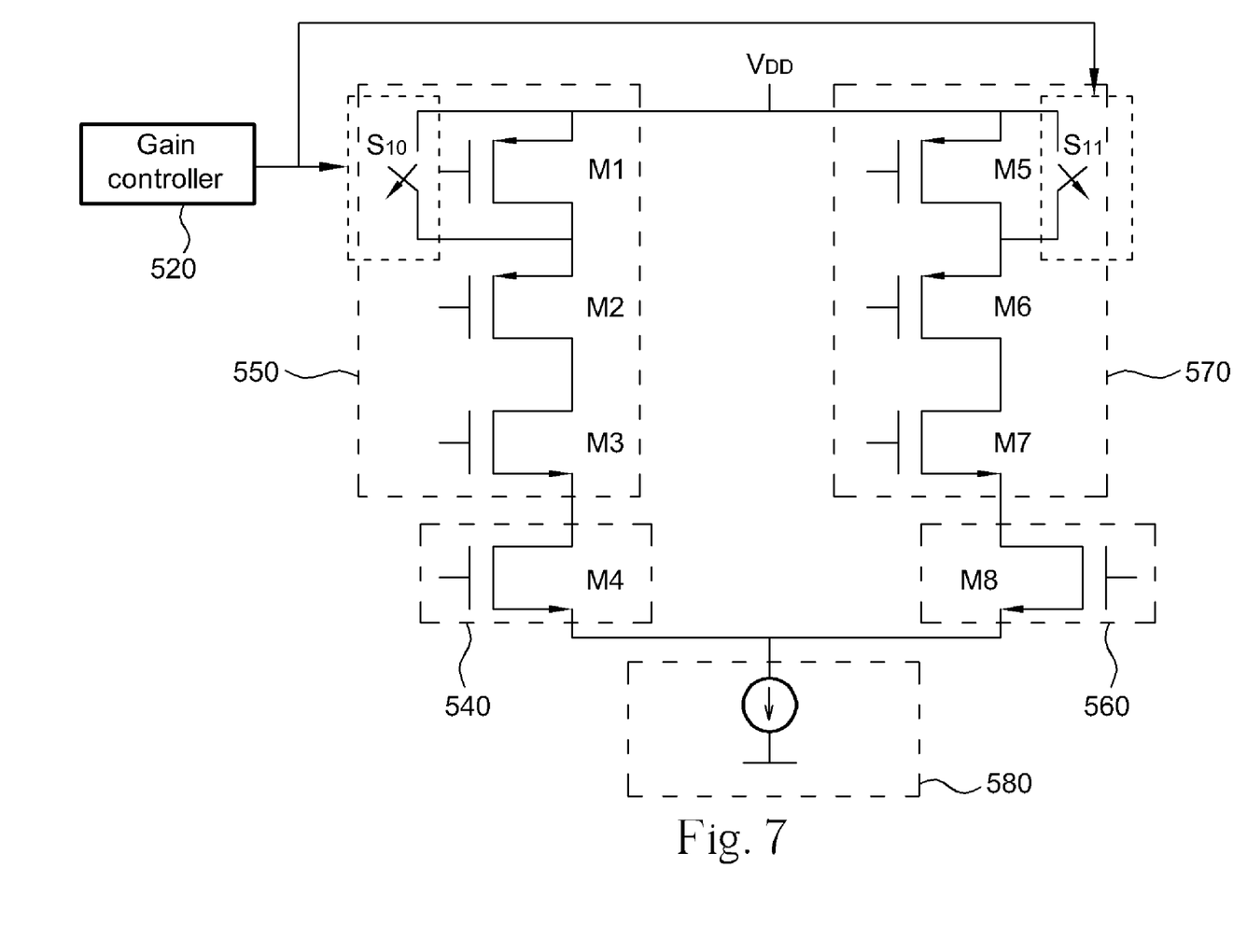
FIG. 7 is a diagram of an operational amplifier and the gain controller of a first embodiment according to the present invention.

Please refer to FIG. 7, which is a diagram of the operational amplifier 530 and the gain controller 520 of a first embodiment according to the present invention. As shown in FIG. 7, the source and drain of the transistor M1 are coupled to each other through a switch S10, and the source and drain of the transistor M5 are coupled to each other through a switch S11. The gain controller 520 is a control circuit to control the switches S10 and S11, so that the switches S10 and S11 correspond to the clock ph1, which is utilized to control the above-mentioned switches S1, S2, S5, S8, and S9. Therefore, the switches S10 and S11 are turned on in the sample mode to couple the source and drain of the transistors M1 and M5. This reduces the current gain of the operational amplifier 530 in the sample mode.

Figure 8:
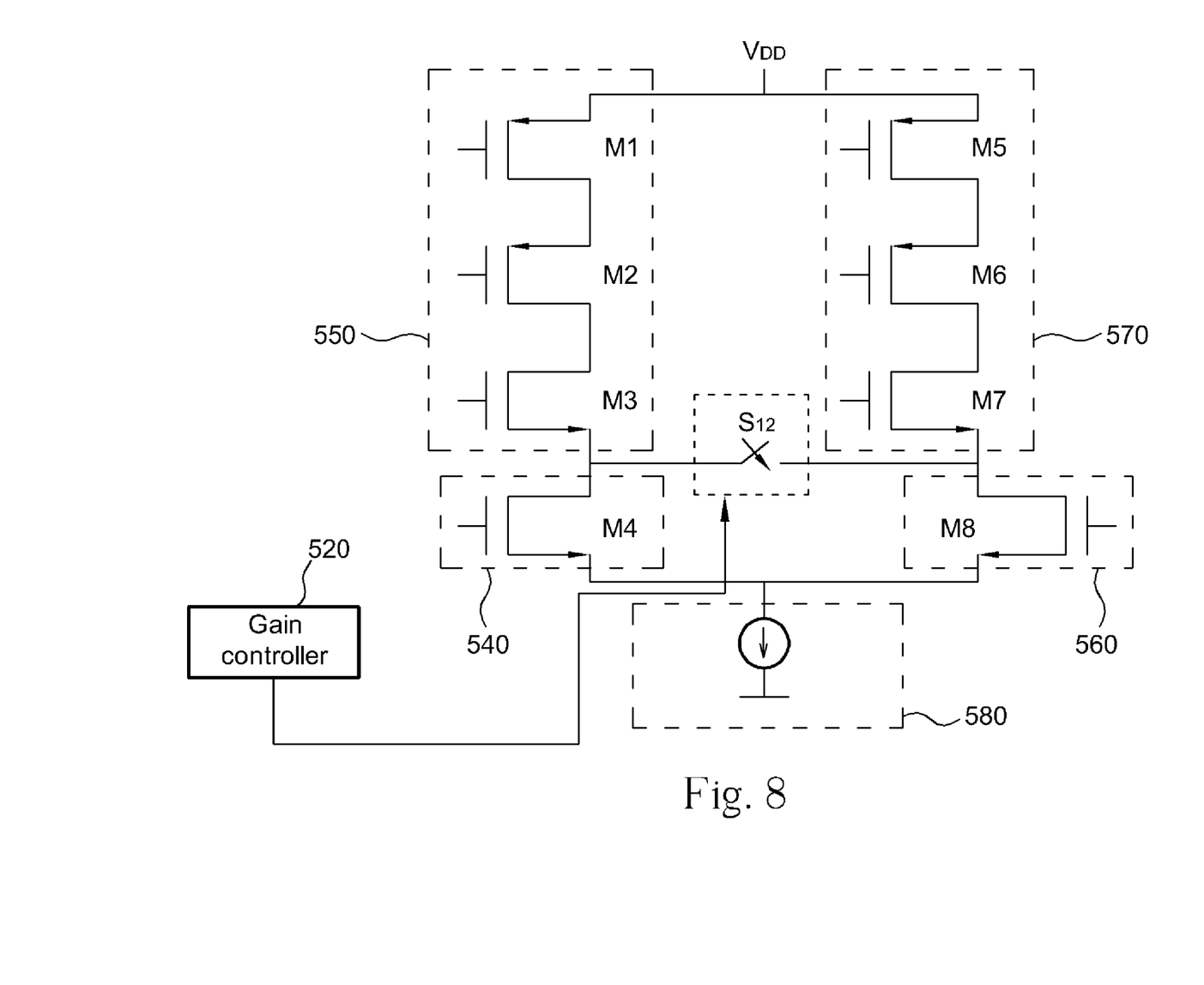
FIG. 8 is a diagram of an operational amplifier and a gain controller of a second embodiment according to the present invention.

Please refer to FIG. 8, which is a diagram of the operational amplifier 530 and the gain controller 520 of a second embodiment according to the present invention. As shown in FIG. 8, the source of the transistor M3 is coupled to the source of the transistor M7 through a switch S12. The switch S12 also corresponds to the clock ph1. This means that the switch S12 is turned on in the sample mode to couple the sources of the transistors M3 and M7. Therefore, the switch S12 can also reduce the gain of the operational amplifier 530 in the sample mode.

Figure 9:
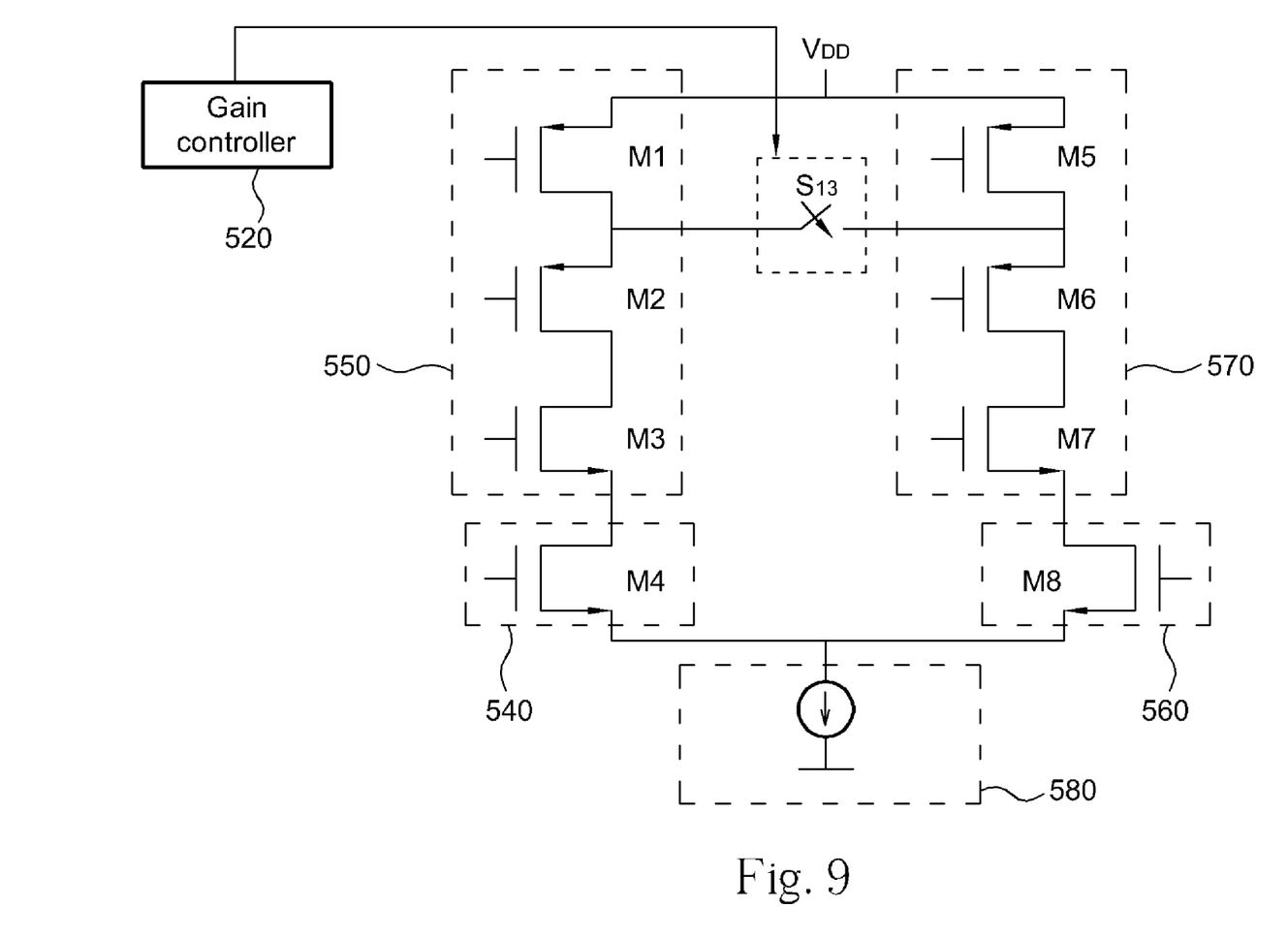
FIG. 9 is a diagram of an operational amplifier and a gain controller of a third embodiment according to the present invention.

Please refer to FIG. 9, which is a diagram of the operational amplifier 530 and the gain controller 520 of a third embodiment according to the present invention. As shown in FIG. 9, the drain of the transistor M1 is coupled to the drain of the transistor M5 through a switch S13. The switch S13 also corresponds to the clock ph1. This means that the switch S13 is turned on in the sample mode to couple the drains of the transistors M1 and M5. Therefore, the switch S13 can also reduce the gain of the operational amplifier 530 in the sample mode.

Figure 10:
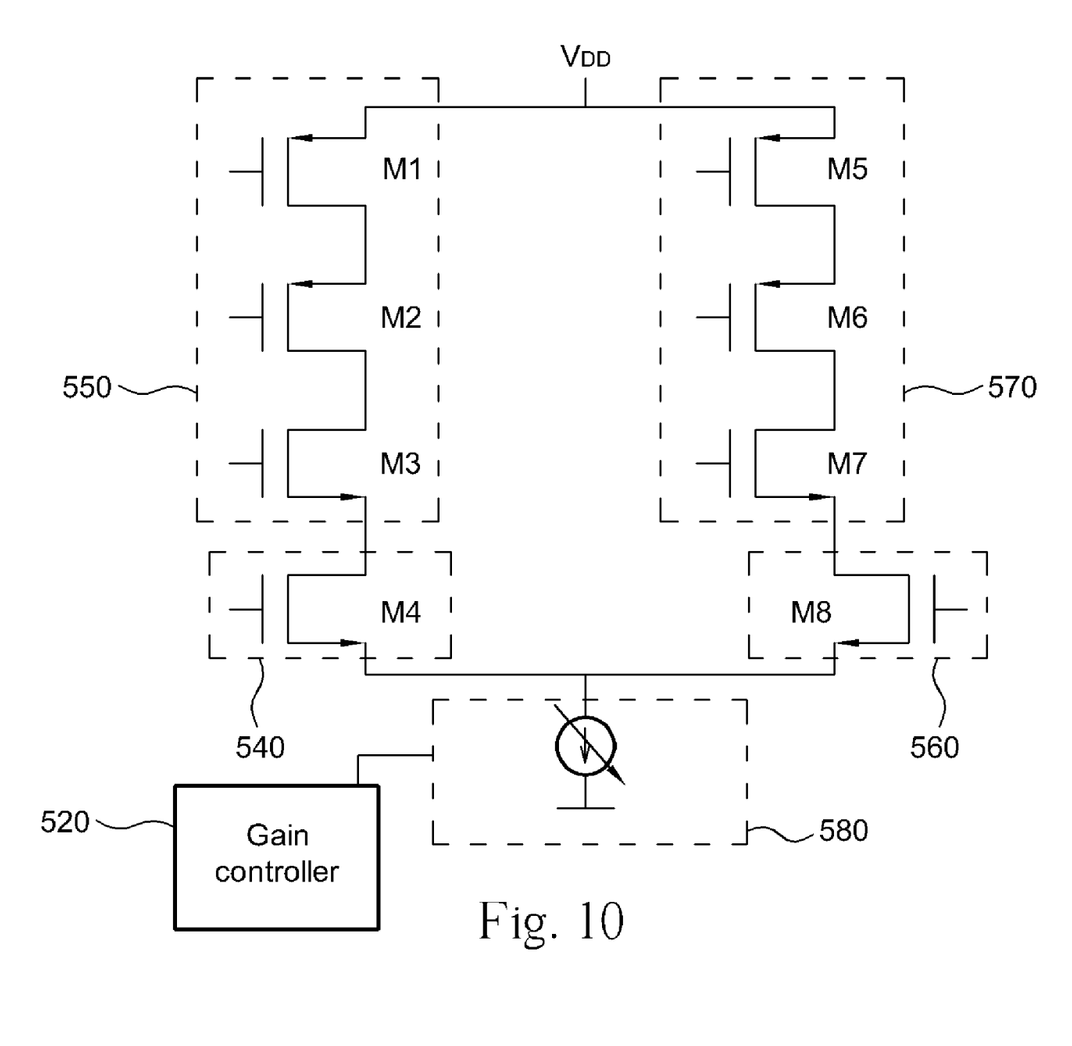
FIG. 10 is a diagram of an operational amplifier and a gain controller of a fourth embodiment according to the present invention.

Please refer to FIG. 10, which is a diagram of the operational amplifier 530 and the gain controller 520 of a fourth embodiment according to the present invention. In this embodiment, the gain controller 520 is coupled to the bias 580 of the operational amplifier 530. Therefore, the biasing current, which is outputted by the bias 580, can be adjusted by the gain controller 520 in the sample mode. This can also reduce the gain of the operational amplifier 530. The adjustable bias 580 can be implemented through utilizing a plurality of parallel current sources in co-ordination with switches, or other circuits. For the circuit and operations of the adjustable bias are well known, they are omitted here.

In the above disclosure, the circuits are all differential circuits. However, this is not a limitation of the present invention. In other words, single-ended circuits can also be utilized. Please refer to FIG. 6 again, for example, the transistors M1-M4 and the bias 580 can be regarded as a single-ended amplifier. Therefore, when the sample and hold circuit 510 is in the sample mode, a switch (not shown) can be utilized to couple the source and the drain of the transistor M1 such that the gain of the single-ended amplifier can be reduced. On the other hand, the above-mentioned method of controlling the biasing currents can also be utilized to reduce the gain of the single-ended amplifier. This also obeys the spirit of the present invention.

As known by those skilled in the art, the signal sampling apparatus and related signal sampling method can be utilized in the analog-to-digital converter fields or other fields.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal sampling apparatus for generating an output signal according to an input signal, the signal sampling apparatus comprising:

a sample and hold circuit (S/H circuit), for sampling the input signal in a sample mode to generate a sample signal, the sample and hold circuit comprising an amplifier having a gain for generating the output signal according to the sample signal in a hold mode, wherein the amplifier comprises an output stage, and the output stage comprises a switch coupled between outputs of the amplifier for pulling down a voltage difference between the outputs of the amplifier in a predetermined clock period; and a gain controller, coupled to the amplifier, for adjusting the gain, wherein the gain controller controls the switch to adjust the gain.

2. The signal sampling apparatus of claim 1, wherein the gain controller adjusts the gain in the sample mode.

3. The signal sampling apparatus of claim 2, wherein the gain controller reduces the gain in the sample mode.

4. The signal sampling apparatus of claim 1, wherein the amplifier comprises a bias for providing a bias current, and the gain controller controls the bias to adjust the gain.

5. The signal sampling apparatus of claim 1, wherein the switch is turned on in the sample mode.

6. A signal sampling apparatus for generating an output signal according to an input signal, the signal sampling apparatus comprising:

a sample and hold circuit (S/H circuit), for sampling the input signal in a sample mode to generate a sample signal, the sample and hold circuit comprising an amplifier having a gain for generating the output signal according to the sample signal in a hold mode; and a gain controller, coupled to the amplifier, for adjusting the gain; wherein the amplifier comprises an output stage, and the output stage comprises a plurality of transistors and a switch, the switch being coupled to two ends of one transistor of the plurality of transistors.

7. The signal sampling apparatus of claim 6, wherein the switch is turned on in the sample mode.

8. The signal sampling apparatus of claim 6, wherein the plurality of transistors are all MOSFETs.

9. A signal sampling apparatus for generating an output signal according to an input signal, the signal sampling apparatus comprising:

a sample and hold circuit (S/H circuit), for sampling the input signal in a sample mode to generate a sample signal, the sample and hold circuit comprising an amplifier having a gain for generating the output signal according to the sample signal in a hold mode; and a gain controller, coupled to the amplifier, for adjusting the gain;

wherein the amplifier comprises:

a first gain stage comprising a plurality of first transistors; and a second gain stage, symmetric to the first gain stage, comprising:

a plurality of second transistors;

a first switch, coupled to two ends of a first transistor of the plurality of the first transistors; and a second switch, coupled to two ends of a second transistor of the plurality of the second transistors.

10. The signal sampling apparatus of claim 9, wherein the first and the second transistors are both MOSFETs.

11. The signal sampling apparatus of claim 9, wherein the first switch and the second switch are both turned on in the sample mode.

12. A signal sampling apparatus for generating an output signal according to an input signal, the signal sampling apparatus comprising:

a sample and hold circuit (S/H circuit), for sampling the input signal in a sample mode to generate a sample signal, the sample and hold circuit comprising an amplifier having a gain for generating the output signal according to the sample signal in a hold mode; and a gain controller, coupled to the amplifier, for adjusting the gain;

wherein the amplifier comprises:

a first gain stage comprising a plurality of first transistors; and a second gain stage, symmetric to the first gain stage, the second gain stage comprising:

a plurality of second transistors;

a switch, coupled to a first end of one of the first transistors and a first end of one of the second transistors;

wherein said first and said second transistors correspond to each other and the switch is turned on in the sample mode.

13. The signal sampling apparatus of claim 12, wherein the first and the second transistors are both MOSFETs, and the first end of the first transistor and the first end of the second transistor are both drains.

14. A signal sampling method for generating an output signal according to an input signal, the signal sampling method comprising:

sampling the output signal in a sample mode in order to generate a sample signal;

generating the output signal according to the sample signal and a gain in a hold mode; and adjusting the gain in the sample modes;

wherein the step of adjusting the gain comprises turning on a switch between two ends of a transistor in the sample mode.

15. The signal sampling method of claim 14, wherein the step of adjusting the gain is reducing the gain in the sample mode.

16. The signal sampling method of claim 14, wherein the step of adjusting the gain is reducing a bias current in the sample mode.

17. A signal sampling apparatus for sampling an input signal to generate an output signal, the signal sampling apparatus comprising:

a sample and hold unit for performing a sampling operation on the input signal in a sample mode and generating the output signal according to a result of the sampling operation in a hold mode, the sample and hold unit comprising a gain unit for providing a gain; and a gain adjusting unit, coupled to the gain unit, for generating a control signal to adjust the gain;

wherein the gain adjusting unit controls the gain such that the gain unit has a first gain in the sample mode and has a second gain in the hold mode, and the first gain is less than the second gain.

* * * * *